(12) United States Patent
Ghanayem et al.

(10) Patent No.: US 6,192,601 B1
(45) Date of Patent: Feb. 27, 2001

(54) METHOD AND APPARATUS FOR REDUCING PARTICLE CONTAMINATION DURING WAFER TRANSPORT

(75) Inventors: Steve G. Ghanayem; Madhavi Chandrachood, both of Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/583,322

(22) Filed: May 30, 2000

Related U.S. Application Data

(62) Division of application No. 09/249,538, filed on Feb. 11, 1999, now Pat. No. 6,106,634.

(51) Int. Cl.$^7$ .................................................. F26B 5/04
(52) U.S. Cl. ........................ 34/406; 34/412; 34/467; 34/497; 34/92; 34/558; 134/19
(58) Field of Search ........................ 134/19, 18, 1.2, 134/1.3; 118/719, 724; 34/92, 524, 526, 530, 540, 60, 558, 575, 403, 406, 467, 471, 493, 497, 412

(56) References Cited

U.S. PATENT DOCUMENTS

| | | | |
|---|---|---|---|
| 4,458,427 | * | 7/1984 | Akeret .................................. 34/487 |
| 4,928,537 | * | 5/1990 | Liu et al. ......................... 73/863.86 |
| 5,280,983 | * | 1/1994 | Maydan et al. .................. 294/119.1 |
| 5,628,121 | * | 5/1997 | Brooks et al. ......................... 34/61 |
| 5,937,541 | * | 8/1999 | Weigland et al. ..................... 34/565 |
| 5,970,717 | * | 10/1999 | Tateyama ................................ 62/3.2 |

* cited by examiner

*Primary Examiner*—Pamela Wilson
(74) *Attorney, Agent, or Firm*—Townsend and Townsend and Crew

(57) ABSTRACT

The present invention provides method and apparatus for reducing particulate contamination during the processing of a substrate. In one embodiment, the step of preheating a substrate in a preheater to a desired temperature. The preheated substrate is transferred from the preheater to a buffer region having a pressure therein that is between about two (2) Torr and about seven hundred and sixty (760) Torr. The preheated substrate is transferred from the buffer region to a reaction chamber. Thermophoretic forces help repel particles away from the substrate surface during substrate transfer.

19 Claims, 8 Drawing Sheets

METHOD AND APPARATUS FOR REDUCING PARTICLE CONTAMINATION DURING WAFER TRANSPORT

This application is a division of Ser. No. 09/249,538, filed Feb. 11, 1999, now U.S. Pat. No. 6,106,634.

BACKGROUND OF THE INVENTION

This invention relates generally to the reduction of particle contamination on wafers, and more specifically, to the use of thermophoresis to reduce particle contamination on wafers during wafer transport within a multi-chamber or multi-station substrate processing tool.

Integrated circuit (IC) processing technology is continuously concerned with reducing the feature size of components to increase the amount of circuitry that can be packed onto an integrated circuit of a given size and to increase the speed of operation by reducing the distance that signals need to travel within such circuits. Particulates with a diameter even several times smaller than the feature size of a component can cause failure of the IC if the particulate was present at a critical location during an important process step. This problem is particularly acute for large area ICs such as microprocessors and greater than four (4) megabit memories because such ICs have an increased area over which a critical defect can occur.

The multilayer structure of some ICs also increases the effect of particulates on yield because a particulate incorporated into one level of an IC can affect not only the circuitry of that level, but also circuitry on other levels. A defect in an embedded level of an IC can propagate through overlying areas, distorting the topography and thus disrupting operation of those circuit elements. For at least these reasons, it is important to minimize the amount of particulates that come into contact with a wafer immediately before and during processing.

FIG. 1 illustrates some common particulates and particulate sizes that are present in the ambient atmosphere. Expensive, intricate clean rooms and clean room procedures are used to significantly reduce the amount of airborne particulates to which a wafer is exposed during IC fabrication. Unfortunately, clean rooms cannot prevent particulates from being produced within an integrated circuit fabrication system, such as a multi-chamber or multi-station substrate processing tool.

Several techniques have been used within individual processing chambers within such tools to help reduce the likelihood of substrate contamination, including chamber cleaning procedures. For some processing procedures, the substrate is heated within the processing chamber which helps produce thermophoretic forces capable of repelling some contaminants away from the substrate.

However, contamination of wafers can be particularly acute during wafer transport, that is, during transfer of a wafer to the processing chamber or between chambers within a multi-chamber wafer processing system. During transport, the wafer may be exposed to different gases, possibly existing at different pressures and temperatures. These gases and the chambers possibly contain different particulate matter capable of contaminating the wafers. For example, a processing chamber may have a buildup of aluminum fluoride particles on the walls which can dislodge and contaminate a wafer being transferred into the processing chamber. Further, processing system components, such as robots, valves and the like, may generate particles, notwithstanding efforts to keep these components clean.

SUMMARY OF THE INVENTION

The present invention provides methods and apparatus for reducing particle contamination during wafer or substrate processing, and more specifically, reduces particle contamination during the transport of a wafer within a substrate processing system. As indicated, it is not uncommon for some substrate contamination to occur during transport of the substrate from one station to another within the substrate processing system. The present invention involves the use of temperatures and pressures within the substrate processing system in a manner which facilitates thermophoretic forces to reduce the amount of particles which may impact a substrate surface.

Thermophoresis occurs in a gas having a temperature gradient. Gas molecules located in the hotter region of the gas have greater momentum than gas molecules in the cooler region. As a result, particulate matter suspended within the gas will be impacted on one side by molecules that are more energetic than the molecules impacting the particle on the other side. The more energetic molecules in the hotter gas region have a greater momentum and, therefore, transfer more momentum to the particle than less energetic molecules in the cooler gas region. This difference in momentum transferred by the gas molecules to the particle is capable of driving some particles toward the cooler gas region.

If, for example, an object such as a substrate were heated to a temperature that exceeded the temperature of the surrounding gas environment, the heated substrate would transfer a portion of that heat to gas molecules located near the heated substrate. Gas molecules located further from the substrate surface would be heated to a lesser degree, or not at all, thereby establishing a temperature gradient in the gas. The resulting thermophoretic forces within the gas are capable of propelling at least some particles towards the cooler gas, and hence, away from the heated substrate. Depending in part on the temperature gradient established, particles of some size may experience thermophoretic effects that overcome the effects of gravity or other forces otherwise causing the particles to propagate towards the substrate.

At least a part of the present invention is the recognition that controlling a substrate's temperature, and the temperature and pressure of the substrate's environment, during substrate transfer can cause at least some particles to be repelled away from the substrate.

The present invention provides methods of reducing particulate contamination using thermophoresis during the transfer of a substrate. In one embodiment, the method includes the step of preheating a substrate in a preheater to a desired temperature. The preheated substrate is transferred from the preheater to a buffer region having a pressure therein that is between about two (2) Torr and about seven hundred and sixty (760) Torr. The preheated substrate is transferred from the buffer region to a reaction chamber. In this manner, by heating the substrate to a desired temperature and introducing the substrate into a buffer region having a desired pressure, preferably between about two (2) Torr and about seven hundred and sixty (760) Torr, gas molecules within the buffer region experience a localized heating close to the substrate and, as a result, produce thermophoretic forces which help repel particles away from the substrate surface. While some prior art systems preheat the substrate prior to transferring the substrate to a processing chamber, the transferring step typically occurs in near vacuum conditions (i.e., pressures less than about one (1) Torr and typically less than about 500 milli-Torr). As indicated the present invention uses higher pressures to help produce thermophoretic effects during substrate transferring steps.

In one aspect of the method, during the transferring steps, the substrate desired temperature and buffer region pressure are at levels sufficient to create thermophoretic effects capable of repelling at least some particles away from the substrate. In one particular aspect, particles repelled away from the substrate by thermophoresis have a diameter that is between about 0.01 microns and about 1.00 microns. Such particles can be a wide range of contaminants, for example, particles of aluminum fluoride.

In one aspect of the method, the preheater comprises a preheat chamber. Alternatively, the preheater may comprise a load lock, whereby the load lock contains multiple substrates. In another aspect, the preheating step includes preheating the substrate to a temperature that is between about 200 degrees Celsius and about 700 degrees Celsius. Heating the substrate to such a desired temperature and transferring the preheated substrate into the buffer region having a specified buffer region pressure provides for thermophoretic effects capable of repelling at least some particles away from the substrate. Such a temperature range would be particularly useful for preheating substrates that will undergo the deposition of a tungsten layer. It will be appreciated by those skilled in the art that the actual temperatures used will depend in part upon the stage of processing or development of the integrated circuit. In one aspect, the transferring steps involve using at least one robot to transfer the substrate from the preheater to the buffer region, and from the buffer region to the reaction chamber.

In one aspect, the preheating step occurs when the preheater has an internal pressure that is between about two (2) Torr and about seven hundred and sixty (760) Torr. In another aspect, the step of transferring the substrate from the preheater to the buffer region occurs when the preheater has an internal pressure that is between about two (2) Torr and about seven hundred and sixty (760) Torr. Preferably, the substrate is transferred from the preheater to the buffer region when the preheater has an internal pressure that is about equal to the buffer region pressure. In this manner, large differences in pressure between the preheater and buffer region, which may otherwise occur, are avoided. As a result, gases internal to the preheater and buffer region do not experience a rapid pressure change which would cause a flow of gas from one region to the other that may adversely affect the desired thermophoretic forces.

In one aspect, the step of transferring the substrate from the buffer region to the reaction chamber occurs when a pressure in the reaction chamber is between about two (2) Torr and about seven hundred and sixty (760) Torr. Preferably, the substrate is transferred from the buffer region to the reaction chamber when a pressure in the reaction chamber is about equal to the buffer region pressure. Where possible, it is preferable that the transferring steps occur when the buffer region pressure, an internal pressure in the preheater and an internal pressure in the reaction chamber are all generally equal. In this manner, gases contained within each of these regions or chambers do not experience rapid pressure changes or the resulting flow of gas from high to low pressure that would occur if the regions and chambers had different pressures. In one particular aspect, the preheating and transferring steps occur in a single multi-chamber substrate processing machine, preferably under vacuum conditions.

In another aspect of the method, the buffer region contains a buffer gas at a buffer gas temperature. During the transferring steps, the substrate desired temperature is greater than the buffer gas temperature. In this manner, the substrate is hotter than the surrounding buffer gas and produces desirable thermophoretic effects. Similarly, the method anticipates a reaction chamber containing a chamber gas at a chamber gas temperature whereby during the step of transferring the substrate from the buffer region to the reaction chamber, the substrate desired temperature is greater than the chamber gas temperature.

In one particular embodiment of a method of reducing particulate contamination, the method comprises the step of heating a substrate in a preheater to a desired temperature that is at least about 200 degrees Celsius. The method further includes transferring the substrate from the preheater to a buffer region wherein the buffer region has a pressure that is between about two (2) Torr and about seven hundred and sixty (760) Torr, and transferring the substrate from the buffer region to a first reaction chamber. In this manner, the substrate is heated to a temperature sufficient to produce thermophoretic effects when introduced into a buffer region having the prescribed pressure.

In one aspect, the method further includes the steps of processing the substrate in the first reaction chamber, transferring the substrate from the first reaction chamber to the buffer region wherein the buffer region pressure is between about two (2) Torr and about seven hundred and sixty (760) Torr, and transferring the substrate from the buffer region to a second reaction chamber. The substrate is then processed in the second reaction chamber. During the transferring steps, the substrate has a temperature that is sufficient to facilitate thermophoresis.

In one particular aspect, the method further includes the steps of processing the substrate in the first reaction chamber, transferring the substrate from the first reaction chamber to the buffer region, and transferring the substrate from the buffer region to the load lock. During the transferring steps, the substrate preferably has a temperature that is sufficient to produce at least some thermophoretic effects. In one aspect, the buffer region contains a buffer gas having a buffer gas temperature and the first reaction chamber contains a chamber gas having a chamber gas temperature. During the transferring steps, the substrate preferably has a temperature that is greater than the buffer gas temperature, and more preferably, greater than both the buffer gas temperature and the chamber gas temperature.

In another particular embodiment, the method of reducing particulate contamination during transfer of a substrate includes the steps of preheating the substrate in a preheater to a desired temperature, preferably between about two hundred (200) degrees Celsius and about seven hundred (700) degrees Celsius. The method includes transferring the preheated substrate to a buffer region and transferring the preheated substrate from the buffer region to a reaction chamber. The transferring steps occur while maintaining the buffer region and reaction chamber at conditions suitable to enable thermophoresis of particles away from the substrate, whereby the particles have a diameter that is between about 0.01 microns and about 1.00 microns.

The present invention further provides a substrate processing system. The system comprises a housing that forms a preheater used for preheating a substrate, a buffer region operably connected to the preheater, and a vacuum chamber operably connected to the buffer region. A substrate holder is located within the vacuum chamber for holding the substrate. A substrate moving system, located within the buffer region, is used for moving the substrate from the preheater through the buffer region and into the vacuum chamber. At least one temperature control system is provided for maintaining a first selected temperature within the preheater and a second selected temperature within the vacuum chamber. At least one pressure control system is provided for maintaining first, second and third selected pressures within the preheater, buffer region and vacuum chamber, respectively. A controller for controlling the substrate moving system, the temperature control system and the pressure control system is provided. A memory is coupled to the controller including a computer-readable medium having a computer-readable program embodied therein for directing operation of the substrate processing system. The computer-readable program includes a first set of instructions for controlling the substrate moving system to move the substrate from the preheater onto the substrate holder and a second set of instructions for controlling the temperature control system to maintain the selected temperatures within the preheater and vacuum chamber. The computer-readable program further includes a third set of instructions for controlling the pressure control system to maintain the selected pressures within the preheater, buffer region and vacuum chamber.

Other features and advantages of the invention will appear from the following description in which the preferred embodiment has been set forth in detail in conjunction with the accompanying drawings.

DETAILED DESCRIPTION OF THE PREFERRED EMBODIMENT

Figure 1:
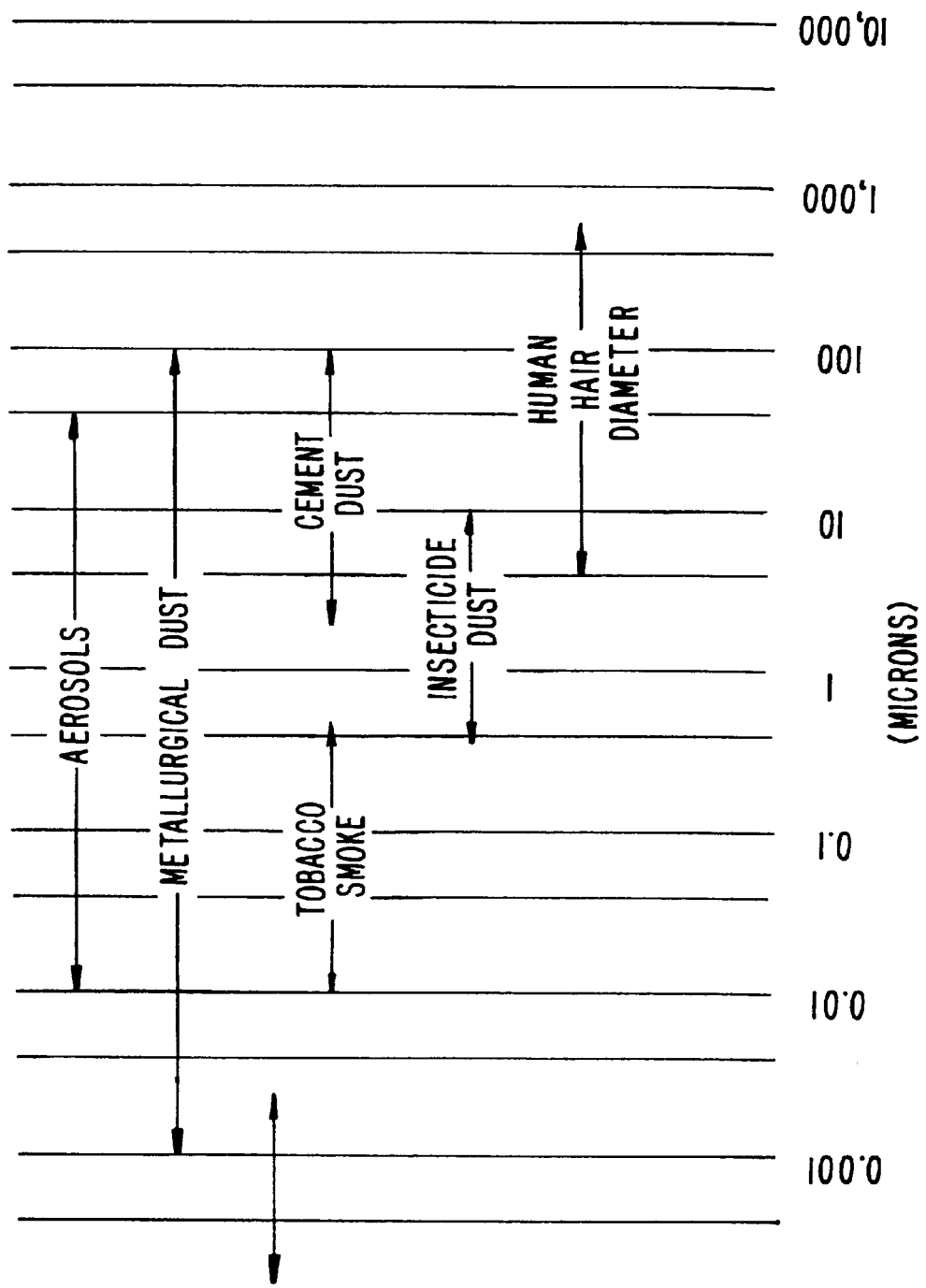
FIG. 1 illustrates common particulates and particulate sizes that are present in the ambient atmosphere.
Figure 2:
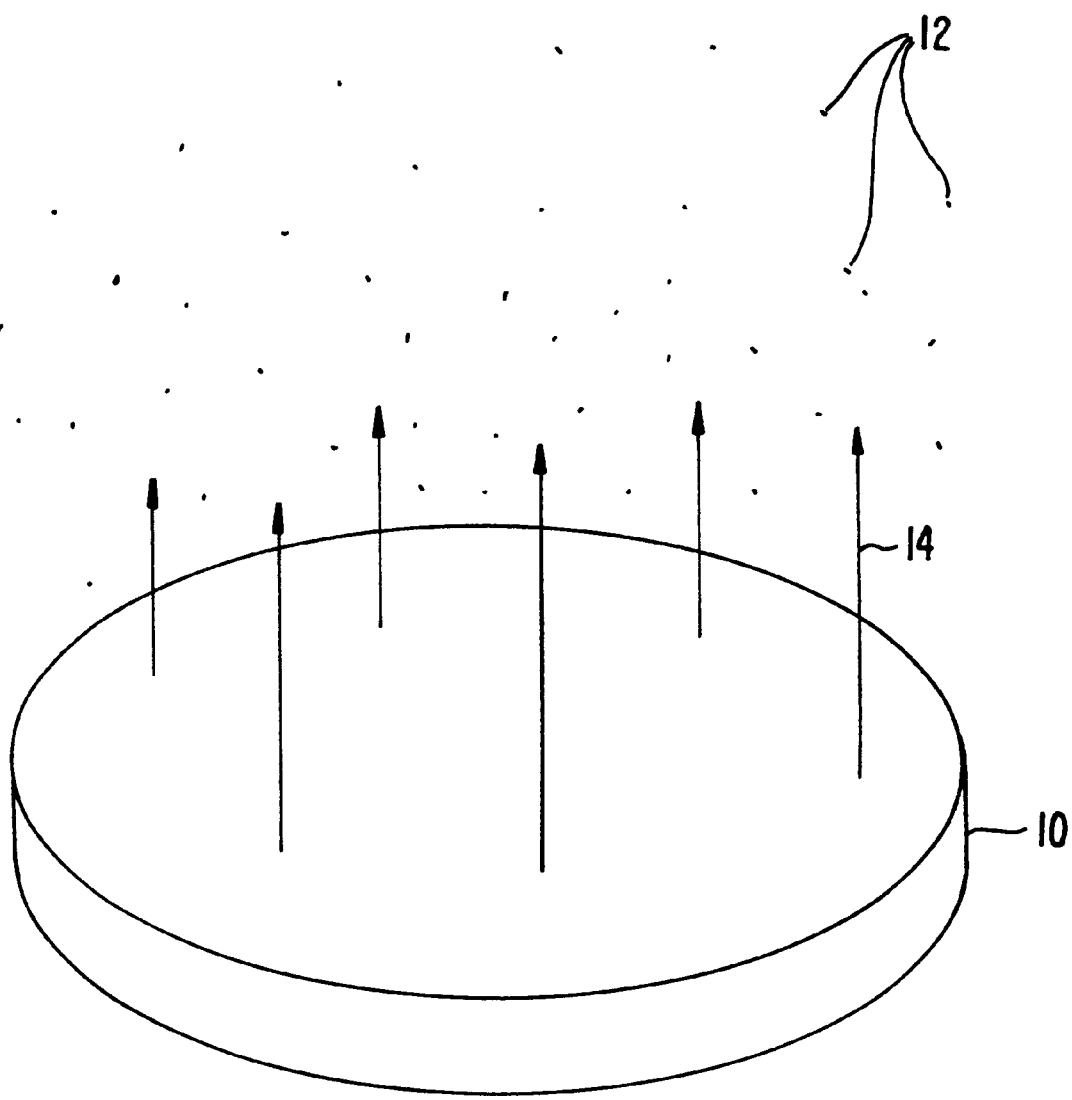
FIG. 2 illustrates the thermophoretic effects of a preheated substrate.

FIG. 2 illustrates the thermophoretic effects possible as the result of a preheated substrate passing through a gaseous region having a pressure that is between about 2 Torr and about 760 Torr. As depicted in FIG. 2, a substrate 10 that has been preheated to a desired temperature heats at least some gas molecules located in close proximity to substrate 10. For example, for processes involving the deposition of a tungsten layer onto substrate 10, substrate 10 preferably is preheated to between about 200 degrees Celsius and about 700 degrees Celsius, and in some cases, to between about 350 degrees Celsius and about 475 degrees Celsius. For other processes, the desired temperature may be higher or lower than this range. The gas located close to substrate 10 may contain a plurality of particles 12 which, if allowed to impact the surface of substrate 10, could potentially cause defects during substrate 10 processing. By preheating substrate 10, which in turn heats gas molecules close to the surface of substrate 10, particles 12 experience a thermophoretic force depicted as arrows 14 capable of driving at least some particles 12 away from substrate 10 as previously described.

Typically, substrate 10 is processed in a multi-chamber processing system and is placed into a reaction chamber where it is heated to a desired temperature. As a result, during the processing step within the reaction chamber, substrate 10 provides thermophoretic effects to particles contained within process gases in the reaction chamber. However, the present invention involves preheating substrate 10 prior to entering the reaction chamber. Substrate 10 is transferred in a preheated state through a buffer region and into the reaction chamber. The buffer region is maintained at a pressure sufficient to create thermophoretic effects capable of repelling at least some particles contained within gases surrounding preheated substrate 10 away from the surface of substrate 10. Typically, the buffer region is not heated so that the temperature of substrate 10 is greater than the temperature within the buffer region.

Figure 3:
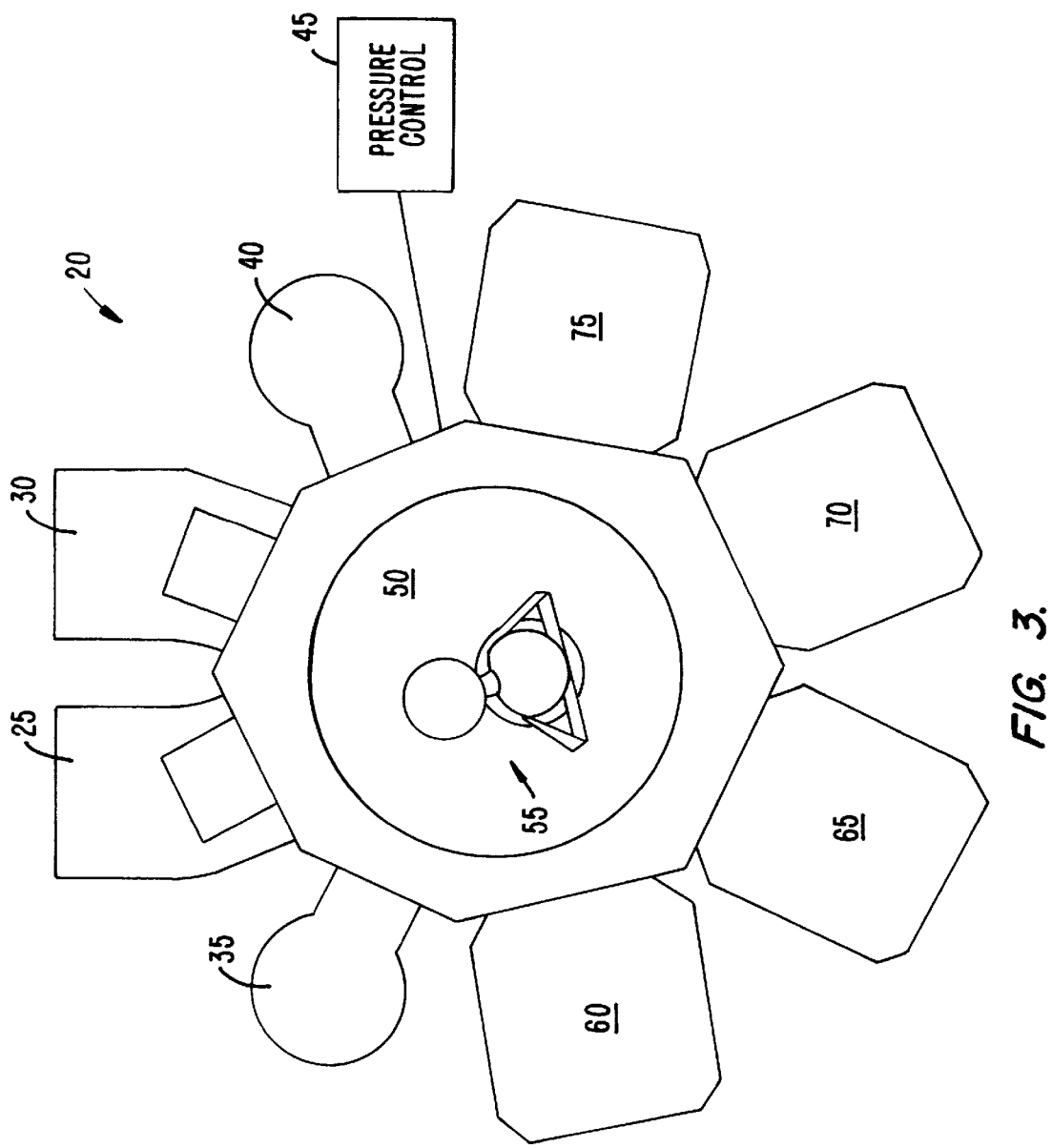
FIG. 3 depicts a simplified top planar view of a substrate processing machine capable of carrying out the methods, and constituting part of the substrate processing system, of the present invention.

FIG. 3 depicts a multi-chamber substrate processing system 20 which includes at least one load lock 25 and, as depicted in FIG. 3, preferably a second load lock 30. Processing system 20 further includes first and second preheaters 35 and 40. Several reaction chambers 60, 65, 70 and 75 are spaced around a buffer region 50 containing a substrate moving system 55. Load locks 25 and 30 are used to hold a plurality of substrates 10 for introduction into buffer region 50. According to the present invention, substrate 10 is preheated either in preheaters 35 and 40 or within load locks 25 and 30. Load locks capable of holding a plurality of substrates are further described in U.S. Pat. No. 5,656,902 and U.S. Pat. No. 5,391,035, both of which are assigned to Applied Materials, Inc., the assignee of the present application, and both of which are hereby incorporated by reference for all purposes. Preheat mechanisms for use in the load locks 25 and 30 and/or preheaters 35 and 40 can include resistively heated platens, heat lamps or the like.

The advantage of preheating substrate 10 within load locks 25 and 30 is that plurality of substrates 10 may be preheated at the same time. It may be desirable, however, to preheat substrates 10 within preheaters 35 and 40, thereby avoiding the need to complicate load locks 25 and 30 with preheat mechanisms. Preferably, substrate 10 is preheated to a temperature that is at least about 200 degrees Celsius. It will be appreciated by those skilled in the art that the present invention is capable of reducing particle contamination for many different types of substrate processing operations. In an illustrative example, it is used to reduce contamination during the transfer of substrates 10 prior to and/or following tungsten deposition. In one embodiment, substrate 10 is preheated to a temperature that is between about 200 degrees Celsius and about 700 degrees Celsius. Such a temperature range is compatible with the deposition of tungsten layers in a processing chamber, however, thermophoresis effects are possible at lower or higher substrate 10 temperatures.

Substrate moving system 55 preferably comprises a robot 55. Robot 55 transfers substrate 10 from load locks 25, 30 and/or from preheaters 35, 40, into buffer region 50 and then into the appropriate substrate processing chamber 60, 65, 70 or 75. Details of exemplary robots 55 for use with the present invention are disclosed in U.S. Pat. No. , 5,656,902, assigned to Applied Materials, Inc., the assignee of the present invention, the complete disclosure of which is hereby incorporated by reference for all purposes.

The transfer of substrate 10 from preheaters 35, 40 or load locks 25, 30 into buffer region 50 and on into the desired reaction chamber 60–75 occurs under conditions which provide for thermophoretic effects capable of repelling at least some particles, and preferably particles having diameters between about 0.01 microns and about 1.00 microns, away from substrate 10. To allow for such thermophoretic effects, buffer region 50 preferably has a pressure that is between about 2 Torr and about 760 Torr. Substrate 10 preferably is heated to a temperature that is greater than a buffer region temperature for transfer through the buffer region.

Buffer region 50 has a pressure control system 45 that includes an exhaust and a throttle valve (not shown). System 45 operates in a similar fashion as the chamber exhaust and throttle valve described in conjunction with FIG. 4. Inert gases, preferably nitrogen, argon and the like, are introduced into buffer region 50. Such buffer region gases are maintained at pressures to encourage thermophoresis. In this manner, the use of thermophoresis helps reduce particulate contamination of substrate 10 during the crucial transferring steps of substrate 10 to one of the processing chambers 60, 65, 70 or 75. Preferably, the internal pressures of both buffer region 50 and the reaction chamber 60–75 into which substrate 10 will be transferred are between about 2 Torr and about 760 Torr. In some instances, it is still more preferable if the buffer region 50 internal pressure is about equal to the internal pressure of the reaction chamber 60–75 into which substrate 10 will be transferred. In one embodiment, the buffer region pressure and the reaction chamber pressure are both equal to about 30 Torr and in another embodiment, both pressures are equal to about 4.5 Torr.

In still other instances, it is preferable for load locks 25, 30 and/or preheaters 35, 40 pressures to be slightly higher than buffer region 50 pressures, which in turn are slightly higher than chamber 60–75 pressures. In such a manner, a flow of gas proceeds from load locks 25, 30 and/or preheaters 35, 40, through buffer region 50 to chambers 60–75 and exits the chamber 60–75 exhaust system (not shown in FIG. 3). For example, in one particular embodiment, load locks 25, 30 have a pressure that is about 34 Torr, buffer region 50 has a pressure that is about 32 Torr and chambers 60–75 have a pressure that is about 30 Torr. The actual pressures within the processing chambers depend, of course, on the process being carried out in that chamber.

It is further desirable to have approximately equal pressures between preheaters 35, 40 and buffer region 50, and/or between load locks 25, 30 and buffer region 50, to reduce the effects of pressure changes on gases. In this manner, particles which may exist within the buffer region 50 gases are not subject to disturbing pressure changes, which would otherwise cause a flow of gases that may adversely affect desired thermophoretic effects. Once inserted into the desired reaction chamber 60–75, substrate 10 is placed onto a substrate holder (as depicted in FIG. 4) located within reaction chamber 60–75. Desired processes, such as CVD of a tungsten layer onto substrate 10, can then occur.

Figure 4A:
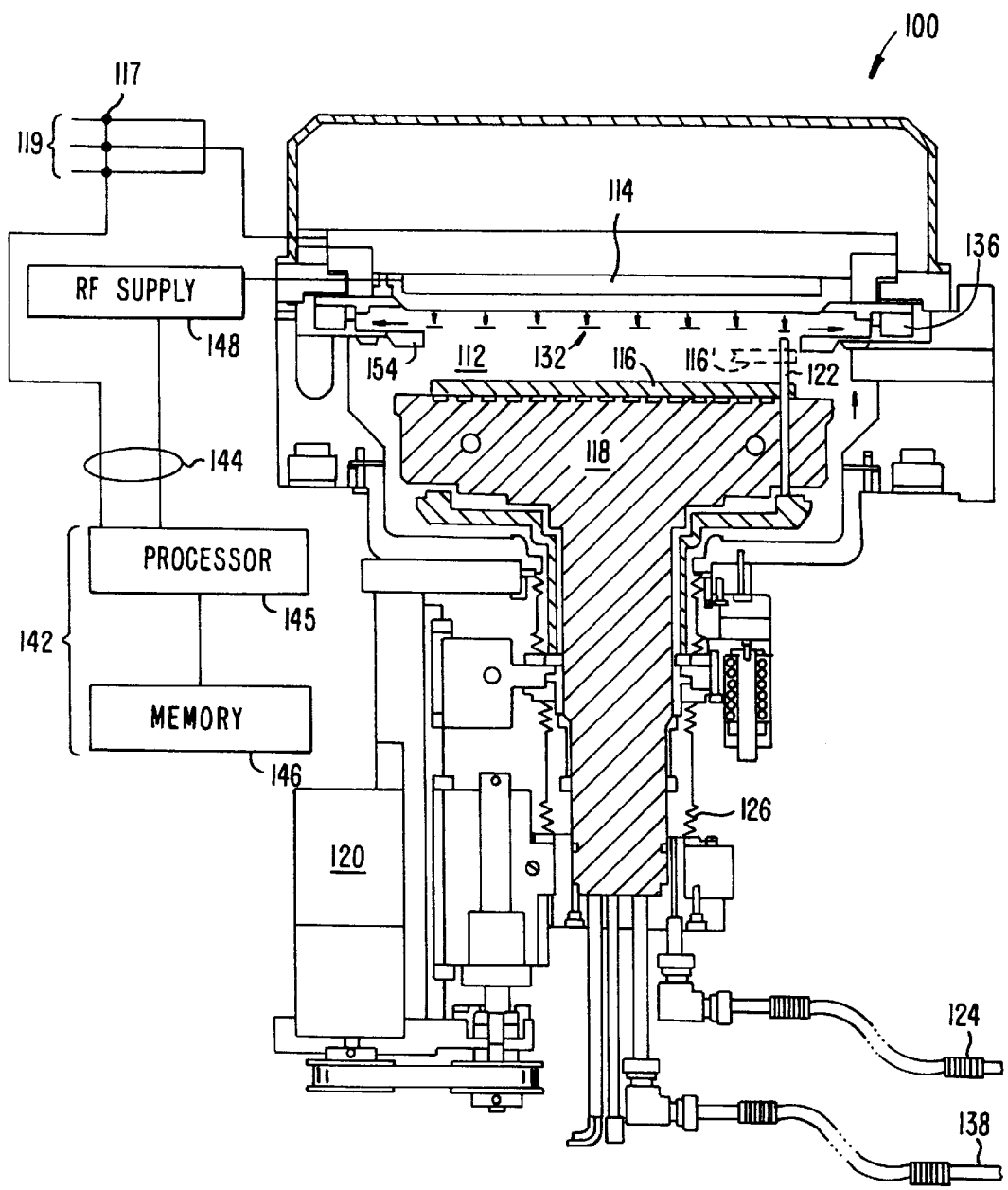
FIGS. 4A and 4B are vertical, cross-sectional views of one embodiment of a simplified chemical vapor deposition apparatus as part of a substrate processing system according to the present invention.
Figure 4B:
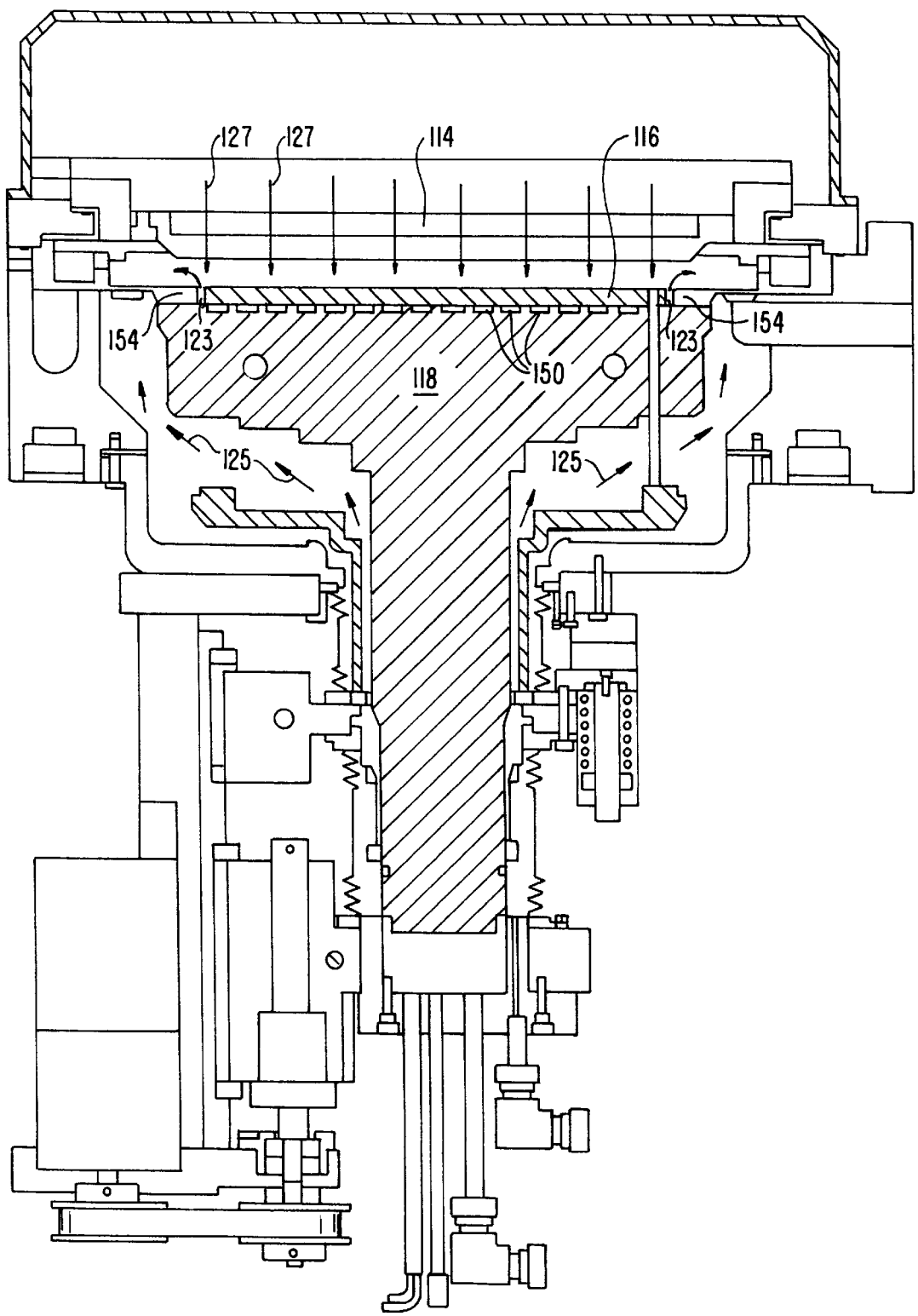

Turning now to FIGS. 4A and 4B, one embodiment of a preferred substrate holder and a reaction chamber system 100 for use with the present invention will be described. Reaction chamber system 100 illustrated in FIGS. 4A and 4B represents one embodiment of a parallel-plate cold-wall chemical vapor deposition (CVD) system 100 having a vacuum chamber 112 in which a deposition or etch process, such as the deposition of a refractory metal, can occur. Vacuum chamber 112 may be one of the chambers 60–75 depicted in FIG. 3. CVD system 100 contains a gas distribution manifold 114 for dispersing process gases to a substrate that rests on a resistively-heated susceptor 118.

Processing chamber 112 may be part of a vacuum processing system having multiple processing chambers connected to a central transfer chamber or buffer region and serviced by a robot such as that shown in FIG. 3. Substrate 116 is brought into chamber 112 by a robot blade through a slit valve in a sidewall of the chamber (not shown). Susceptor 118 is moveable vertically by means of a motor 120. Substrate 116 is brought into chamber when susceptor 118 is in a first position with the substrate located opposite to the slit valve shown as 116'. At position 116', substrate 116 is supported initially by a set of pins 122 that pass through, and are coupled to, susceptor 118. Pins 122 are driven by a single motor assembly. As the susceptor 118 is brought to a processing position 132 opposite gas distribution manifold 114, as shown by the dotted line, pins 122 sink into susceptor 118 and substrate 116 is deposited onto the susceptor. Once positioned on susceptor 118, substrate 116 is affixed to susceptor 118 by a vacuum clamping system, shown more clearly in FIG. 4B as grooves 150.

Referring to both FIGS. 4A and 4B, upon moving upward toward processing position 132, the substrate 116 contacts purge guide 154, which centers substrate 116 on susceptor 118. Edge purge gases 123 are flowed through purge guides 154 across the edge of substrate 116 to prevent deposition gases from contacting the edge and backside of the substrate. Purge gases 125 are also flowed around heater/susceptor 118 to minimize deposition on and around heater/susceptor. These purge gases 125 are supplied from a purge line and are also employed to protect stainless steel bellows 126 from damage by corrosive gases introduced into the chamber during processing.

Deposition and carrier gases are supplied to a deposition zone of chamber 112 through gas lines 119 to manifold 114 in response to the control of valves 117. During processing, gas supplied to manifold 114 is distributed uniformly across the surface of the substrate as shown by arrows 127. Spent processing gases and by-product gases are exhausted from the chamber by means of exhaust system 136. The rate at which gases are released through exhaust system 136 into an exhaust line is controlled by a throttle valve (not shown). During deposition, a second purge gas through gas channels in the susceptor (not shown) and feed line 138 feeds purge gas against the edge of wafer 116 as previously described. An RF power supply 148 can be coupled to manifold 114 to provide for plasma-enhanced CVD (PECVD) cleaning of the chamber.

The throttle valve (not shown), gas supply valves 117, motor 120, resistive heater coupled to susceptor 118, RF power supply 148 and other aspects of CVD system 100 are controlled by a system controller 142 over a plurality of control lines 144 of which only some are shown. An example of a particular CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Chang et al. and assigned to Applied Materials, Inc., the assignee of the present invention, the complete disclosure of which is hereby incorporated by reference for all purposes.

System controller 142 includes a processor 145 that operates under the control of a computer program stored in a computer-readable medium such as a memory 146. The computer program includes sets of instructions that establish the timing, mixture of gases, chamber pressure, temperature, RF power levels, susceptor position, and other parameters of a particular process. The computer program can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked compiled object code, the system user invokes the object code, causing the computer system to load the code in memory. The processor 145 reads and executes the code to perform the tasks identified in the program.

The memory 146, employed to store the computer program, may include a floppy disk drive, tape drive or other storage media. Typically, the system controller 142 components consist of a single board computer (SBC), analog and digital input/output boards, interface boards and stepper motor controller boards. Various parts of CVD system 100 conform to the Versa Modular European (VME) standard which defines board, card cage, and connector dimensions and types. The VME standard also defines the bus structure as having a 16-bit data bus and 24-bit address bus.

Figure 5A:
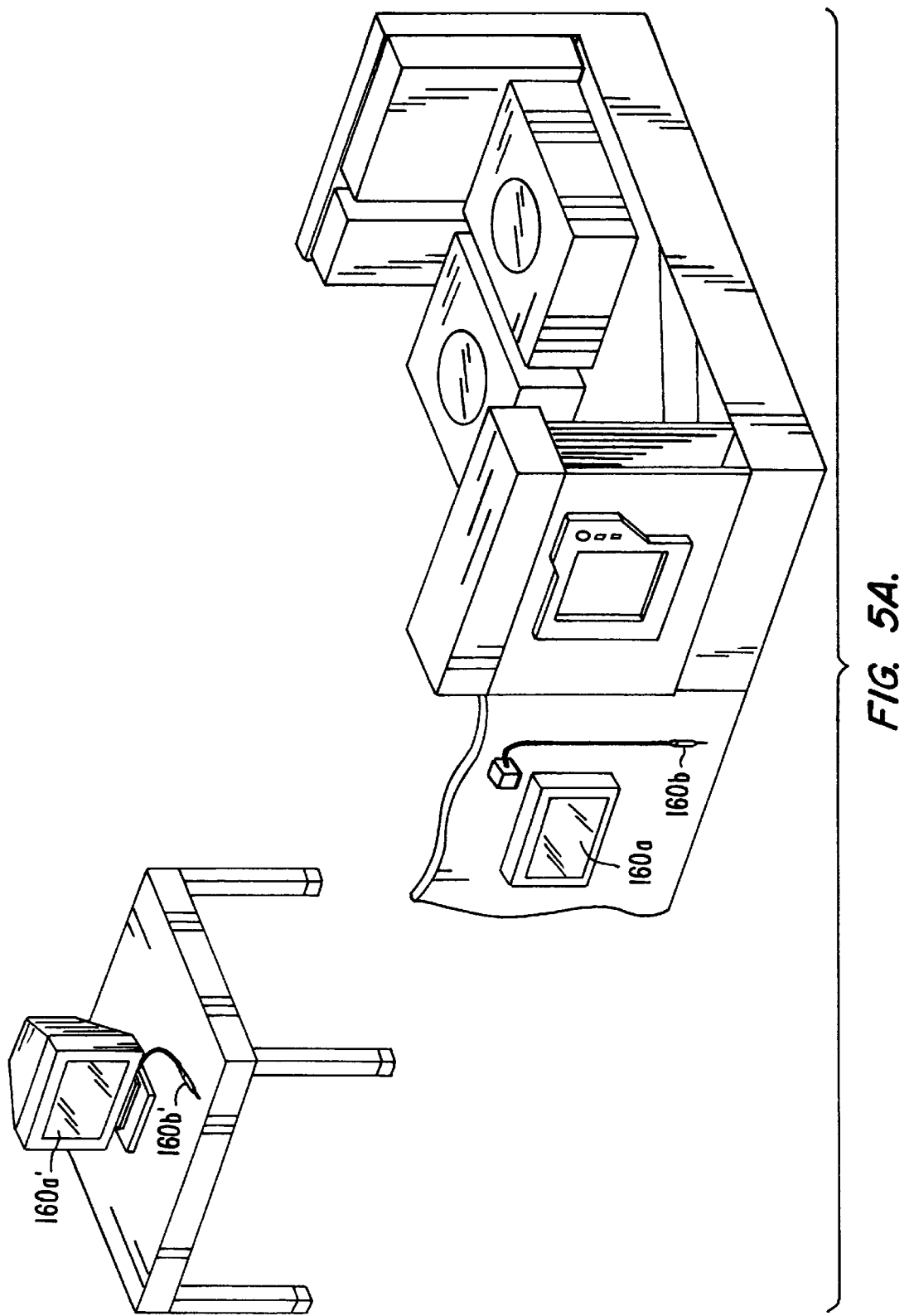
FIG. 5A is a simplified diagram of a system monitor and CVD system in a multi-chamber system, which may include one or more chambers.

Referring to FIG. 5A, the interface between a user and the system controller 142 is via a CRT monitor 160a and a light pen 160b. In the preferred embodiment two monitors 160a are used, one mounted in the clean room wall for the operators and the other behind the wall for the service technicians. Both monitors 160a simultaneously display the same information, but only one light pen 160b is enabled. A light sensor in the tip of light pen 160b detects light emitted by CRT display. To select a particular screen or function, the operator touches a designated area of the display screen and pushes the button on the pen 160b. The touched area changes its highlighted color, or a new menu or screen is displayed, confirming communication between the light pen and the display screen. Other devices, such as a keyboard, mouse, or other pointing or communication device, may be used instead of or in addition to light pen 160b to allow the user to communicate with controller 142.

Figure 5B:
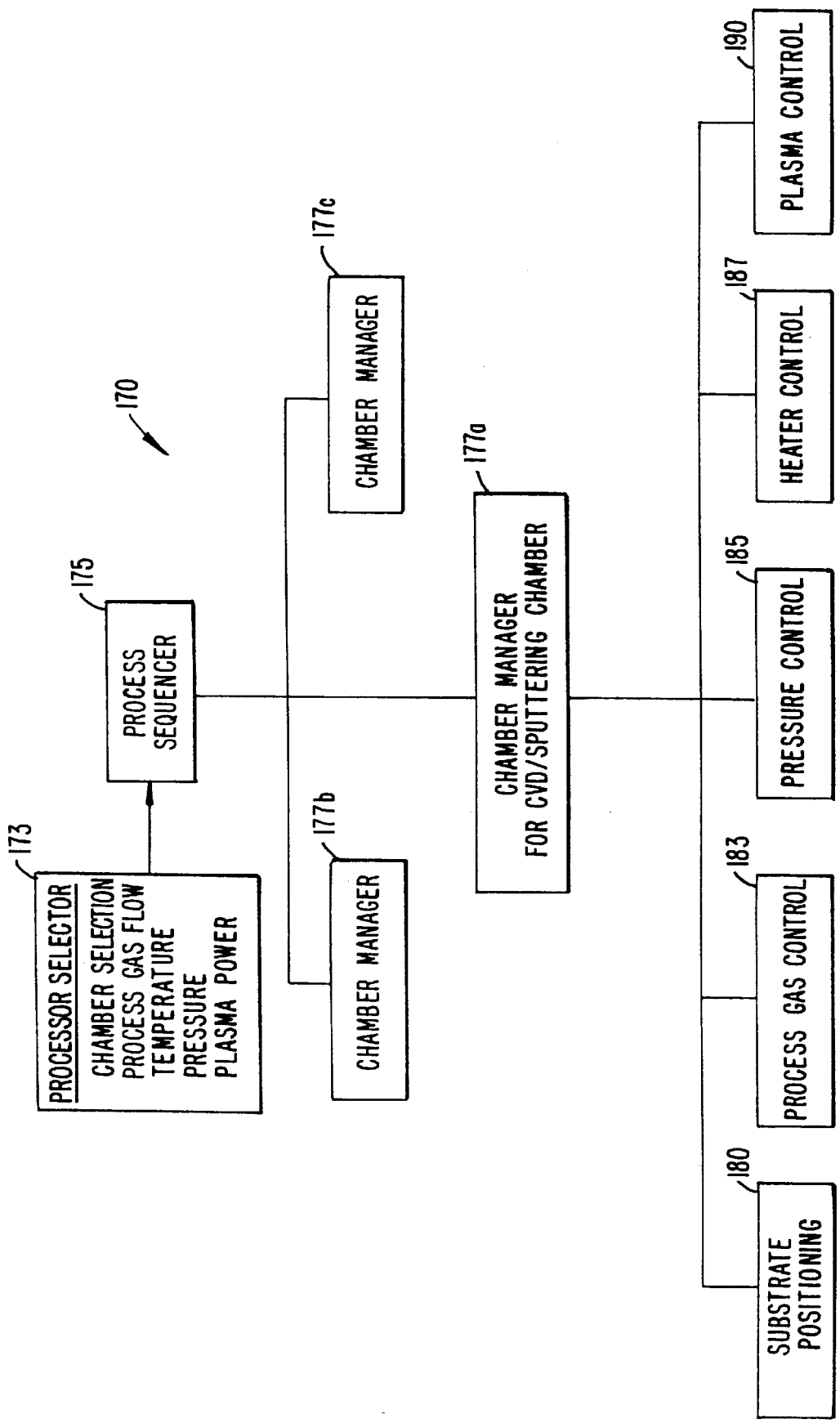
FIG. 5B shows an illustrative block diagram of the hierarchical control structure of the system control software, computer program 170, according to a specific embodiment.

FIG. 5B shows an illustrative block diagram of the hierarchical control structure of the system control software, a computer program 170, according to a specific embodiment. A user enters a process set number and process chamber number into a process selector subroutine 173 in response to menus or screens displayed on the CRT monitor by using the-light pen interface. The process sets are predetermined sets of process parameters necessary to carry out specified processes, and are identified by predefined set numbers. The process selector subroutine 173 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and cooling gas pressure and chamber wall temperature among others are provided to the user in the form of a recipe. Process parameters can further include the desired preheat temperatures and pressures for substrate preheat, and desired pressures for the buffer region as previously described. The parameters specified by the process recipe are entered utilizing the light pen/CRT monitor interface. The signals for monitoring the process are provided by the analog input and digital input boards of the system controller and the signals for controlling the process are output on the analog output and digital output boards of CVD system 100.

A typical process recipe carried out within one of chambers 60–75 involves the heating of susceptor 118, which in turn heats substrate 116. The time to conduct such a step can be reduced or eliminated in the present invention as a result of substrate 116 preheat in preheaters 35, 40 or load locks 25, 30. In this manner, a further advantage of the present invention is the increased throughput of substrates through reaction chambers 60–75 resulting from the reduced or eliminated process step (substrate heating) usually performed in reaction chambers 60–75.

A process sequencer subroutine 175 comprises program code for accepting the identified process chamber and set of process parameters from the process selector subroutine 173, and for controlling operation of the various process chambers. Multiple users can enter process set numbers and process chamber numbers, or a user can enter multiple process set numbers and process chamber numbers, so the sequencer subroutine 175 operates to schedule the selected processes in the desired sequence. Preferably the sequencer subroutine 175 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 175 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 175 determines which process chamber and process set combination is going to be executed next, the sequencer subroutine 175 causes execution of the process set by passing the particular process set parameters to a chamber manager subroutine 177a–c which controls multiple processing tasks in a process chamber 112 according to the process set determined by the sequencer subroutine 175. For example, the chamber manager subroutine 177a comprises program code for controlling sputtering and CVD process operations in the process chamber 112. The chamber manager subroutine 177 also controls execution of various chamber component subroutines which control operation of the chamber components necessary to carry out the selected process set. Examples of chamber component subroutines are a substrate positioning subroutine 180, a process gas control subroutine 183, a pressure control subroutine 185, a heater control subroutine 187, and plasma control subroutine 190, in some embodiments. A person having ordinary skill in the art would readily recognize that other chamber control subroutines can be included depending on what processes are desired to be performed in the process chamber 112. In operation, the chamber manager subroutine 177a selectively schedules or calls the process component subroutines in accordance with the particular process set being executed. The chamber manager subroutine 177a schedules the process component subroutines similarly to how the sequencer subroutine 175 schedules which process chamber 112 and process set is to be executed next. Typically, the chamber manager subroutine 177a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 5B. The substrate positioning subroutine 180 comprises program code for controlling chamber components that are used to load the substrate 116 onto the susceptor 118 and, optionally, to lift the substrate to a desired height in the chamber 112 to control the spacing between the substrate and the gas distribution manifold 114. This subroutine 180 further may include commands to operate robot 55 in order to transfer substrate 10 between load locks 25 and 30, preheaters 35 and 40, buffer region 50, and chambers 60–75. Alternatively, robot 55 can be operated by a separate subroutine or subroutines. Further, preheat operations in load locks 25 and 30 or preheaters 35 and 40, and the control of temperatures and pressures in buffer region 50, are preferably controlled by separate subroutines.

When a substrate is loaded into the process chamber 112, the susceptor 118 is lowered to receive the substrate, and thereafter, the susceptor 118 is raised to the desired height in the chamber, to maintain the substrate at a first distance or spacing from the gas distribution manifold during the CVD process. In operation, the substrate positioning subroutine 180 controls movement of the susceptor 118 in response to process set parameters related to the support height that are transferred from the chamber manager subroutine 177a.

The process gas control subroutine 183 has program code for controlling process gas composition and flow rates. In some processes, an inert gas such as argon is flowed into the chamber 112 to stabilize the pressure in the chamber before reactive process gases are introduced into the chamber. For these processes, the process gas control subroutine 183 is programmed to include steps for flowing the inert gas into the chamber 112 for an amount of time necessary to stabilize the pressure in the chamber, and then the steps described above would be carried out.

The pressure control subroutine 185 comprises program code for controlling the pressure in the chamber 112 by regulating the size of the opening of the throttle valve in the exhaust system 136 of the chamber. The size of the opening of the throttle valve is set to control the chamber pressure to the desired level in relation to the total process gas flow, size of the process chamber, and pumping setpoint pressure for the exhaust system 136. When the pressure control subroutine 185 is invoked, the desired, or target, pressure level is received as a parameter from the chamber manager subroutine 177a. The pressure control subroutine 185 operates to measure the pressure in the chamber 112 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 185 can be written to open or close the throttle valve to a particular opening size to regulate the chamber 112 to the desired pressure.

In a similar fashion, buffer region 50 includes pressure control system 45 operated by a pressure control subroutine (not shown). Buffer region 50 pressure control system 45 includes an exhaust and a throttle valve (not shown) operably attached to the exhaust for controlling pressures within buffer region 50 to desired levels in a similar fashion as described for controlling chamber 115 pressures.

The heater control subroutine 187 comprises program code for controlling the current to a heating unit that is used to heat the substrate. Preheat operations of the present invention preferably reduce or eliminate the need to heat substrate 116 after it is placed on susceptor 118. In the event substrate 116 requires preheat within chambers 60–75, the heater control subroutine 187 is invoked by the chamber manager subroutine 177a and receives a target, or setpoint, temperature parameter. The heater control subroutine 187 determines the temperature by measuring voltage output of a thermocouple located in a susceptor 118, comparing the measured temperature to the setpoint temperature, and increasing or decreasing current applied to the heating unit to obtain the setpoint temperature. The temperature is obtained from the measured voltage by looking up the corresponding temperature in a stored conversion table, or by calculating the temperature using a fourth-order polynomial.

When an embedded loop is used to heat the susceptor 118, the heater control subroutine 187 gradually controls a ramp up/down of current applied to the loop. Additionally, a built-in fail-safe mode can be included to detect process safety compliance, and can shut down operation of the heating unit if the process chamber 112 is not properly set up.

In some embodiments, the chamber 112 is outfitted with an RF power supply 148 that is used for chamber cleaning or other operations. When a chamber cleaning plasma process is employed, plasma control subroutine 90 comprises program code for setting the frequency RF power levels applied to the process electrodes in the chamber 112. Similar to the previously described chamber component subroutines, the plasma control subroutine 190 is invoked by the chamber manager subroutine 177a.

The above CVD system description is mainly for illustrative purposes and should not be considered as limiting the scope of the present invention. Other substrate processing equipment such as electron cyclotron resonance (ECR) plasma CVD devices, induction coupled RF high density plasma CVD devices, etch, ion implantation or sputtering equipment, or the like may be employed. Additionally, variations of the above described system such as variations in platen or susceptor design, heater design, location of RF power connections and others are possible. The method of controlling particle contamination according to the present invention is not limited to any specific substrate processing apparatus.

In addition to the substrate processing system 20 depicted in FIG. 3, other processing systems, including single-chamber processing systems, may be used within the scope of the present invention. The multi-chamber integrated processing system disclosed in U.S. Pat. No. 4,951,601 may be used, the complete disclosure of which is hereby incorporated by reference for all purposes. U.S. Pat. No. 4,951,601 is assigned to Applied Materials, Inc., assignee of the present application.

Figure 6:
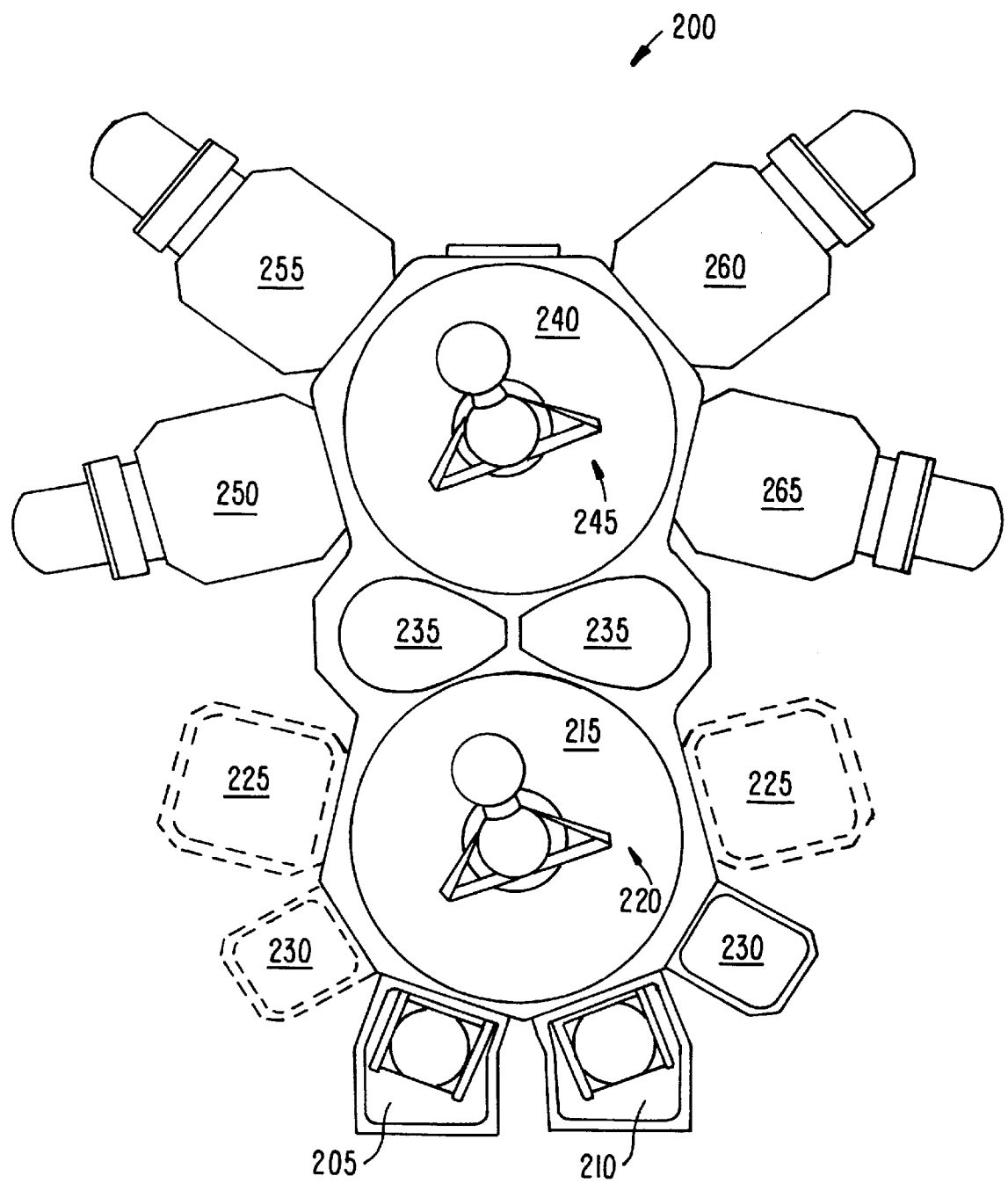
FIG. 6 depicts an alternative embodiment of a multi-chamber processing system capable of carrying out the methods according to the present invention.

FIG. 6 depicts still another system for use with the methods, and as part of the processing system, of the present invention. FIG. 6 depicts a cluster tool system 200 that includes vacuum load lock chambers 205 and 210. Load lock chambers 205 and 210 maintain vacuum conditions within inner chamber 215 while substrates enter and exit system 200. A robot 220 serves substrates from/to load lock chambers 205 and 210 to substrate processing chambers 225 and heating chambers 230. Processing chambers 225 can be outfitted to perform a number of substrate processing operations such as CVD, etch or the like. Heating chambers 230 can be used in heat treatment steps such as anneal steps. Chambers 230 may also be used to heat a substrate during the preheating step of the present invention.

Pass-through chambers 235 are used to maintain appropriate vacuum conditions in inner chamber 240 while allowing substrates to be transferred from robot 220 to a robot 245. Robot 245 serves substrates from pass-through chambers 235 to substrate processing chambers 250 to 265. Similar to processing chambers 225, processing chambers 250 to 265 can be outfitted to perform a variety of substrate processing operations. In one instance, processing chamber 250 is outfitted to sputter deposit a titanium layer; processing chamber 255 is outfitted to sputter deposit a titanium nitride layer and processing chamber 260 is outfitted to sputter deposit an aluminum layer.

During operation, substrates are brought to vacuum load lock chambers 205 and 210 by a conveyor belt or robot system (not shown) that operates under the control of computer program executed by a processor (not shown), or possibly by hand delivery. Also, robots 220 and 245 operate under control of the computer program executing on the processor to transfer substrates between the various processing chambers of cluster tool 200.

To further illustrate the present invention, an exemplary tungsten deposition process will be described in conjunction with FIGS. 3 and 4. Substrate 10 is provided to load lock 25, 30. Substrate 10 is preheated in load lock 25, 30 to between about 200 degrees Celsius and about 700 degrees Celsius. Alternatively, robot 55 transfers substrate 10 from load lock 25, 30 to preheater 35, 40 and substrate preheat occurs in preheater 35, 40. Once preheated, substrate 10 is transferred through buffer region 50 and into reaction chamber 60. During the transfer of substrate 10, buffer region 50 and chamber 60 are maintained at pressures between about two (2) Torr and about seven hundred and sixty (760) Torr to facilitate thermophoresis.

Substrate 10 is placed onto susceptor 118 within chamber 60, and the deposition of a layer of tungsten can occur. Due to the preheating of substrate 10, little to no heating of substrate 10 is required when substrate 10 is placed on susceptor 118. It may be desirable to operate the resistive heater in susceptor 118 to maintain substrate 10 at a desired temperature during deposition. Once the deposition of tungsten is complete, substrate 10 is transferred to either another chamber 65–75, or returned to load locks 25, 30. During the transfer steps, substrate 10 temperature preferably remains at a temperature that is greater than the temperature of gases in buffer region 50 to facilitate thermophoresis.

The invention has now been described in detail. However, it will be appreciated that certain changes and modifications may be made. Therefore, the scope and content of this invention are not limited by the foregoing description; rather, the scope and content are to be defined by the following claims.

What is claimed is:

1. A substrate processing system comprising:
   a housing defining a preheater for preheating a substrate, a buffer region operably connected to said preheater, and a process chamber operably connected to said buffer region;
   a substrate holder, located within said process chamber, for holding said substrate;
   a substrate moving system within said buffer region for moving said substrate from said preheater, through said buffer region and into said process chamber;
   at least one temperature control system for maintaining a first selected temperature within said preheater and a second selected temperature within said process chamber;
   at least one pressure control system for maintaining a first selected pressure within said preheater, a second selected pressure within said buffer region, and a third selected pressure within said process chamber;
   a controller for controlling said substrate moving system, said temperature control system and said pressure control system; and
   a memory coupled to said controllers said memory comprising a computer-readable medium having a computer-readable program embodied therein for directing operation of said substrate processing system, said computer-readable program comprising;
      instructions for controlling said preheater and said temperature control system to preheat a substrate in said preheater to a desired substrate temperature;
      instructions to control said substrate moving system to move said substrate from said preheater through said buffer region and into said process chamber; and
      instructions for controlling said pressure control system to maintain a pressure within said buffer region between about two (2) Torr and about seven hundred and sixty (760) Torr.

2. The system of claim 1 wherein said instructions for controlling said preheater and said temperature control system, and said instructions for controlling said pressure control system operate to produce said desired substrate temperature and said buffer region pressure at levels sufficient to repel at least some particles away from said substrate when said substrate is moved from said preheater through said buffer region.

3. The system of claim 1 wherein said preheater comprises a preheat chamber.

4. The system of claim 1 wherein said preheater comprises a load lock adapted to hold a plurality of substrates.

5. The system of claim 1 further comprising a plurality of process chambers coupled to said buffer region.

6. The system of claim 1 wherein said instructions to control said preheater and said temperature control system operate to preheat said substrate to between about 200 degrees Celsius and about 700 degrees Celsius.

7. The system of claim 1 wherein said substrate moving system comprises a robot.

8. The system of claim 1 further comprising instructions to control said pressure control system to maintain said first selected pressure to be between about two (2) Torr and about seven hundred and sixty (760) Torr.

9. The system of claim 1 further comprising instructions to control said pressure control system to maintain said first selected pressure to be about equal to said second selected pressure, said first and second selected pressures being between about two (2) Torr and about seven hundred and sixty (760) Torr.

10. The system of claim 1 further comprising instructions to control said pressure control system to maintain said second selected pressure to be about equal to said third selected pressure, said second and third selected pressures being between about two (2) Torr and about seven hundred and sixty (760) Torr.

11. The system of claim 1 further comprising instructions to control said temperature control system to maintain said first selected temperature to be greater than said second selected temperature.

12. The system of claim 1 wherein said buffer region contains a buffer gas at a buffer gas temperature, and said instructions for controlling said preheater and said temperature control system cause said substrate desired temperature to be greater than said buffer gas temperature.

13. A substrate processing system comprising:
- a housing defining a preheater for preheating a substrate, a buffer region operably connected to said preheater, and a process chamber operably connected to said buffer region;
- a substrate holder, located within said process chamber, for holding said substrate;
- a substrate transfer system within said buffer region for transferring said substrate from said preheater, through said buffer region and into said process chamber;
- a temperature control system for maintaining selected temperatures within said preheater and said process chamber;
- a pressure control system for maintaining selected pressures within said preheater, said buffer region, and said process chamber;
- a controller for controlling said substrate transfer system, said temperature control system and said pressure control system; and
- a memory coupled to said controller, said memory comprising a computer-readable medium having a computer-readable program embodied therein for directing operation of said substrate processing system, said computer-readable program comprising;
  - instructions to control said preheater and said temperature control system to preheat a substrate in said preheater to a desired substrate temperature that is at least about 200 degrees Celsius;
  - instructions to control said substrate transfer system to transfer said substrate from said preheater through said buffer region and into said process chamber; and
  - instructions to control said pressure control system to maintain a pressure within said buffer region between about two (2) Torr and about seven hundred and sixty (760) Torr.

14. The system of claim 13 wherein said computer-readable program further comprises instructions to control said pressure control system to maintain a pressure within said process chamber between about two (2) Torr and about seven hundred and sixty (760) Torr.

15. The system of claim 14 wherein said instructions to control said preheater and said temperature control system, and said instructions to control said pressure control system, operate to maintain said buffer region and said process chamber at conditions suitable to repel particles away from said substrate, at least some of said particles having a diameter that is between about 0.01 microns and about 1.00 microns.

16. A computer-readable storage medium having a computer-readable program embodied therein for directing operation of a substrate processing system, said processing system including a preheater, a substrate transfer system, a process chamber, a buffer region coupled to said preheater and said process chamber, a temperature control system and a pressure control system, the computer readable-program including instructions for operating the substrate processing system in accordance with the following:
- preheating a substrate in said preheater to a desired substrate temperature;
- transferring said preheated substrate from said preheater to a buffer region, said buffer region having a pressure that is between about two (2) Torr and about seven hundred and sixty (760) Torr; and
- transferring said preheated substrate from said buffer region to said process chamber.

17. The computer-readable storage medium as in claim 16 wherein said computer-readable program further comprises instructions for transferring said preheated substrate from said process chamber to a second process chamber.

18. The computer-readable storage medium as in claim 16 wherein said instructions for controlling said preheater and said temperature control system, and said instructions for controlling said pressure control system operate to produce said desired substrate temperature and said buffer region pressure at levels sufficient to repel at least some particles away from said substrate when said substrate is moved from said preheater through said buffer region.

19. The computer-readable storage medium as in claim 16 wherein said buffer region contains a buffer gas at a buffer gas temperature, and said instructions for controlling said preheater and said temperature control system cause said substrate desired temperature to be greater than said buffer gas temperature.

* * * * *